(12) United States Patent
Lee et al.

(10) Patent No.: US 10,324,244 B2
(45) Date of Patent: Jun. 18, 2019

(54) POLARIZER AND DISPLAY DEVICE INCLUDING THE SAME

(71) Applicant: Samsung Display Co., Ltd., Yongin-si (KR)

(72) Inventors: Hee Young Lee, Suwon-si (KR); Sung June Park, Seoul (KR); In Seo Kee, Asan-si (KR); Jin Kyu Kim, Cheongju-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/682,985

(22) Filed: Aug. 22, 2017

(65) Prior Publication Data
US 2018/0095211 A1    Apr. 5, 2018

(30) Foreign Application Priority Data
Sep. 30, 2016    (KR) ........................ 10-2016-0126803

(51) Int. Cl.
| | |
|---|---|
| *G02B 5/30* | (2006.01) |
| *G02F 1/13363* | (2006.01) |
| *G02F 1/1333* | (2006.01) |
| *G02F 1/1335* | (2006.01) |
| *H01L 51/00* | (2006.01) |
| *H01L 51/52* | (2006.01) |

(52) U.S. Cl.
CPC ....... *G02B 5/3041* (2013.01); *G02F 1/13363* (2013.01); *G02F 1/133634* (2013.01); *G02F 1/133305* (2013.01); *G02F 1/133528* (2013.01); *G02F 2001/133638* (2013.01); *G02F 2413/04* (2013.01); *G02F 2413/07* (2013.01); *G02F 2413/11* (2013.01); *H01L 51/0097* (2013.01); *H01L 51/5281* (2013.01)

(58) Field of Classification Search
CPC ................ G02B 5/3041; G02B 5/3083; G02F 1/133528; G02F 1/13363; G02F 2001/133638
USPC ............ 359/487.01, 487.02, 489.02, 489.07, 359/489.15; 349/96, 117, 118, 119
See application file for complete search history.

(56) References Cited

U.S. PATENT DOCUMENTS

| | | | | |
|---|---|---|---|---|
| 7,649,599 | B2 * | 1/2010 | Kim ................... | G02F 1/133632 349/117 |
| 2006/0203162 | A1 * | 9/2006 | Ito ....................... | G02F 1/13363 349/117 |
| 2006/0274229 | A1 * | 12/2006 | Ito ...................... | G02F 1/133634 349/96 |

(Continued)

FOREIGN PATENT DOCUMENTS

| | | |
|---|---|---|
| JP | 5273775 | 8/2013 |
| JP | 2014-123099 | 7/2014 |

(Continued)

*Primary Examiner* — Ricky D Shafer
(74) *Attorney, Agent, or Firm* — H.C. Park & Associates, PLC

(57) ABSTRACT

An exemplary embodiment of the present invention provides a polarizer including a first retardation layer and a second retardation layer having different retardation values with respect to each other, a polarization layer disposed on the first retardation layer, a first compensation layer disposed between the first retardation layer and the second retardation layer, and a second compensation layer disposed below the second retardation layer.

16 Claims, 17 Drawing Sheets

(56) References Cited

U.S. PATENT DOCUMENTS

2008/0180603 A1* 7/2008 Ohsawa ............... G02F 1/1396
   349/96
2017/0192275 A1* 7/2017 Jia ..................... G02F 1/133305
2017/0219756 A1* 8/2017 Lee ..................... G02B 5/3083

FOREIGN PATENT DOCUMENTS

| KR | 10-2013-0000310 | 1/2013 |
| KR | 10-2015-0057290 | 5/2015 |

* cited by examiner

POLARIZER AND DISPLAY DEVICE INCLUDING THE SAME

CROSS-REFERENCE TO RELATED APPLICATION

This application claims priority from and the benefit of Korean Patent Application No. 10-2016-0126803, filed on Sep. 30, 2016, which is hereby incorporated by reference for all purposes as if fully set forth herein.

BACKGROUND

Field

Exemplary embodiments relate to a polarizer and a display device including the same.

Discussion of the Background

When external light is reflected or scattered on a display surface of a display device, an original image displayed on the display device cannot be clearly seen. Particularly, as portable devices such as mobile phones, portable multimedia players (PMP), personal digital assistants (PDA), laptop computers, and the like are developed, there are many cases in which the display device is used outdoors where external light is abundant. Thus problems of reflection and scattering of external light on the display surface of the display device require improvement.

Recently, engineers and scientists are currently developing foldable display devices that may be folded or unfolded. The foldable display device has an advantage in that it is easy to carry and may simultaneously have a large-sized screen. The foldable display device may be applied to various fields such as TVs or monitors, as well as mobile devices such as mobile phones, PMPs, navigation devices, ultra-mobile PCs (UMPC), electronic books, electronic newspapers, and the like.

Unfortunately, it is even more difficult to properly control how external light is reflected or scattered on a foldable display devices, because the display surface of the foldable display device changes shape and must remain flexible enough to fold.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a polarizer and a display device that may have optical characteristics in which a reflection ratio and a color shift for each viewing angle are minimized. Exemplary embodiments also provide a polarizer and an organic light emitting diode display having the same with improved flexibility by keeping the polarizer with thin.

Additional aspects will be set forth in the detailed description which follows, and, in part, will be apparent from the disclosure, or may be learned by practice of the inventive concept.

An exemplary embodiment of the present invention provides a polarizer including a first retardation layer and a second retardation layer having different retardation values with respect to each other, a polarization layer disposed on the first retardation layer, a first compensation layer disposed between the first retardation layer and the second retardation layer, and a second compensation layer disposed below the second retardation layer.

An exemplary embodiment of the present invention provides a display device including a display panel and a polarizer disposed on the display panel. The polarizer may include a plurality of retardation layers having different retardation values, a polarization layer disposed on the plurality of retardation layers, a first compensation layer disposed between the plurality of retardation layers, and a second compensation layer disposed below the plurality of retardation layers.

According to the embodiment of the present invention, it is possible to provide a display device with excellent display quality by reducing a reflection ratio and suppressing a color shift, through a polarizer.

In addition, according to the embodiment of the present invention, it is possible to improve flexibility thereof by reducing an entire thickness of a display device through a polarizer of which thickness is entirely reduced.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
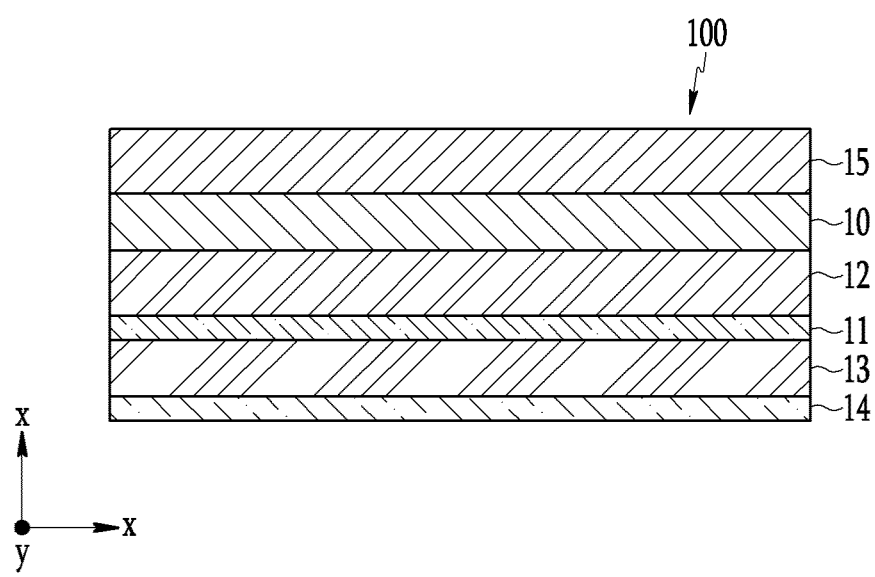
FIG. 1 illustrates a cross-sectional view of a polarizer according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Various exemplary embodiments described below use a polarizer or antireflective film that may be attached to foldable display device. The polarizer is a very thin structure in order for the foldable display device to be folded with a very small curvature radius. IN addition exemplary embodiments, use a polarizer and display device with the same having optical characteristics in which a reflection ratio and a color shift for each viewing angle are minimized.

FIG. 1 illustrates a cross-sectional view of a polarizer according to an exemplary embodiment. As shown in FIG. 1, the polarizer 100 includes a polarization layer 10, a plurality of compensation layers 11 and 14, a plurality of retardation layers 12 and 13, and a passivation layer 15.

The passivation layer 15 may be positioned on the polarization layer 10, and the polarization layer 10 may be positioned on a first retardation layer 12. The first retardation layer 12 may be positioned on a first compensation layer 11, and the first compensation layer 11 may be positioned on a second retardation layer 13. The second retardation layer 13 may be positioned on a second compensation layer 14.

The passivation layer 15, which protects the polarization layer 10, may include triacetyl cellulose (TAC). The passivation layer 15 may have characteristics such as an antireflection characteristic, a low-reflection characteristic, an anti-glare characteristic, a hard coating characteristic, and the like.

The passivation layer 15 may use passivation films generally included in a polarizer, without limitation. For example, the passivation film may be selected from a cellulose-based film, a polyester-based film, a cyclic polyolefin-based film, a polycarbonate-based film, a polyether sulfone-based film, a polysulfone-based film, a polyamide-based film, a polyimide-based film, a polyolefin-based film, a polyarylate-based film, a polyvinyl alcohol-based film, a polyvinyl chloride-based film, a polychlorinated vinylidene-based film, and a combination thereof. The passivation layer 15 may preferably use cellulose-based film, and more preferably, triacetyl cellulose-based film.

The polarization layer 10 may be a linear polarizer layer which converts polarization of incident light into linear polarization. For example, the polarization layer 10 may include a polyvinyl alcohol (PVA) which is doped with iodine.

The polarization layer 10 may include a film including the PVA, a layer formed by coating, a metal pattern layer such as a wire grid polarizer (WGP), and the like.

The polarization layer 10 may be a single layer, or may consist of two or more sublayers. A thickness of the polarization layer 10 may be about 1 μm to about 200 μm. For example, a thickness of the polarization layer 10 may be about 1 μm to 10 μm, 10 μm to 20 μm, 20 μm to 30 μm, 30 μm to 40 μm, 40 μm to 50 μm, 50 μm to 60 μm, 60 μm to 70 μm, 70 μm to 80 μm, 80 μm to 90 μm, 90 μm to 100 μm, 100 μm to 110 μm, 110 μm to 120 μm, 120 μm to 130 μm, 130 μm to 140 μm, 140 μm to 150 μm, 150 μm to 160 μm, 160 μm to 170 μm, 170 μm to 180 μm, 180 μm to 190 μm, and 190 μm to 200 μm. As another example, a thickness of the polarization layer 10 may be 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, 21 μm, 22 μm, 23 μm, 24 μm, 25 μm, 26 μm, 27 μm, 28 μm, 29 μm, 30 μm, 31 μm, 32 μm, 33 μm, 34 μm, 35 μm, 36 μm, 37 μm, 38 μm, 39 μm, 40 μm, 41 μm, 42 μm, 43 μm, 44 μm, 45 μm, 46 μm, 47 μm, 48 μm, 49 μm, 50 μm, 51 μm, 52 μm, 53 μm, 54 μm, 55 μm, 56 μm, 57 μm, 58 μm, 59 μm, 60 μm, 61 μm, 62 μm, 63 μm, 64 μm, 65 μm, 66 μm, 67 μm, 68 μm, 69 μm, 70 μm, 71 μm, 72 μm, 73 μm, 74 μm, 75 μm, 76 μm, 77 μm, 78 μm, 79 μm, 80 μm, 81 μm, 82 μm, 83 μm, 84 μm, 85 μm, 86 μm, 87 μm, 88 μm, 89 μm, 90 μm, 91 μm, 92 μm, 93 μm, 94 μm, 95 μm, 96 μm, 97 μm, 98 μm, 99 μm, 100 μm, 101 μm, 102 μm, 103 μm, 104 μm, 105 μm, 106 μm, 107 μm, 108 μm, 109 μm, 110 μm, 111 μm, 112 μm, 113 μm, 114 μm, 115 μm, 116 μm, 117 μm, 118 μm, 119 μm, 120 μm, 121 μm, 122 μm, 123 μm, 124 μm, 125 μm, 126 μm, 127 μm, 128 μm, 129 μm, 130 μm, 131 μm, 132 μm, 133 μm, 134 μm, 135 μm, 136 μm, 137 μm, 138 μm, 139 μm, 140 μm, 141 μm, 142 μm, 143 μm, 144 μm, 145 μm, 146 μm, 147 μm, 148 μm, 149 μm, 150 μm, 151 μm, 152 μm, 153 μm, 154 μm, 155 μm, 156 μm, 157 μm, 158 μm, 159 μm, 160 μm, 161 μm, 162 μm, 163 μm, 164 μm, 165 μm, 166 μm, 167 μm, 168 μm, 169 μm, 170 μm, 171 μm, 172 μm, 173 μm, 174 μm, 175 μm, 176 μm, 177 μm, 178 μm, 179 μm, 180 μm, 181 μm, 182 μm, 183 μm, 184 μm, 185 μm, 186 μm, 187 μm, 188 μm, 189 μm, 190 μm, 191 μm, 192 μm, 193 μm, 194 μm, 195 μm, 196 μm, 197 μm, 198 μm, 199 μm, and 200 μm.

The retardation layers 12 and 13 may serve to adjust retardation and to improve a viewing angle by adjusting optical characteristics of light. The retardation layers 12 and 13 may convert linear polarization into circular polarization, or circular polarization into linear polarization, by adding retardation to two polarization components that are perpendicular to each other and parallel to an optical axis of the retardation layers 12 and 13.

The two retardation layers 12 and 13 may have different in-plane retardation values. For example, the first retardation layer 12 may have a λ/2 retardation value, and the second retardation layer 13 may have a λ/4 retardation value. In this case, each thickness of the first retardation layer 12 and the second retardation layer 13 may be in a range of about 0.1 μm to about 4 μm. For example, each thickness of the first retardation layer 12 and the second retardation layer 13 may be about 0.1 μm to 1.0 μm, 1.0 μm to 2.0 μm, 2.0 μm to 3.0 μm, and 3.0 μm to 4.0 μm. As another example, each thickness of the first retardation layer 12 and the second retardation layer 13 may be 0.1 μm, 0.2 μm, 0.3 μm, 0.4 μm, 0.5 μm, 0.6 μm, 0.7 μm, 0.8 μm, 0.9 μm, 1.0 μm, 1.1 μm, 1.2 μm, 1.3 μm, 1.4 μm, 1.5 μm, 1.6 μm, 1.7 μm, 1.8 μm, 1.9 μm, 2.0 μm, 2.1 μm, 2.2 μm, 2.3 μm, 2.4 μm, 2.5 μm, 2.6 μm, 2.7 μm, 2.8 μm, 2.9 μm, 3.0 μm, 3.1 μm, 3.2 μm, 3.3 μm, 3.4 μm, 3.5 μm, 3.6 μm, 3.7 μm, 3.8 μm, 3.9 μm, and 4.0 μm.

The two retardation layers 12 and 13 may be positive A plates. In this case, a thickness direction retardation of the first retardation layer 12 for incident light of a wavelength of about 550 nm may be in a range of about 110 nm to about 140 nm. In addition, a thickness direction retardation of the second retardation layer 13 for incident light of a wavelength of about 550 nm may be in a range of about 50 nm to about 80 nm.

Alternatively, the two retardation layers 12 and 13 may be negative A plates. In this case, the thickness direction retardation of the first retardation layer 12 for incident light of a wavelength of about 550 nm may be in a range of about −140 nm to about −110 nm. In addition, the thickness direction retardation of the second retardation layer 13 for incident light of a wavelength of about 550 nm may be in a range of about −80 nm to about −50 nm.

The first retardation layer 12 may have a λ/2 in-plane retardation value and a positive wavelength dispersion characteristic. The in-plane retardation of the first retardation layer 12 for the incident light of the wavelength of about 550 nm may be in a range of about 220 nm to about 270 nm. In this case, the positive wavelength dispersion characteristic corresponds to a characteristic wherein an in-plane retardation value for light of a short wavelength is equal to or greater than an in-plane retardation value for light of a long wavelength.

Specifically, the short-wavelength dispersion value of the first retardation layer 12 may be in a range of about 0.90 to about 1.20. In addition, the long-wavelength dispersion value of the first retardation layer 12 may be in a range of about 0.90 to about 1.20.

Hereinafter, it is assumed that the short-wavelength dispersion value is a ratio of the in-plane retardation for the incident light of the wavelength of about 550 nm and an in-plane retardation value for incident light of a wavelength of about 450 nm. It is assumed that the long-wavelength dispersion value is a ratio of the in-plane retardation for the incident light of the wavelength of about 550 nm and an in-plane retardation value for incident light of a wavelength of about 650 nm.

In addition, the first retardation layer 12 and the polarization layer 10 may be tilt-aligned so that an angle between an optical axis of the first retardation layer 12 and an absorption axis of the polarization layer 10 may be about −20° to about −10° or about 10° to about 20°.

The second retardation layer 13 may have a λ/4 in-plane retardation value and a positive wavelength dispersion characteristic.

The in-plane retardation of the second retardation layer 13 for the incident light of the wavelength of about 550 nm may be in a range of about 110 nm to about 150 nm. The short-wavelength dispersion value of the second retardation layer 13 may be in a range of about 0.90 to about 1.20. The long-wavelength dispersion value of the second retardation layer 13 may be in a range of about 0.90 to about 1.20.

In addition, the second retardation layer 13 and the polarization layer 10 may be tilt-aligned so that an angle between an optical axis of the second retardation layer 13 and an absorption axis of the polarization layer 10 may be about −80° to about −70° or about 70° to about 80°.

The compensation layers 11 and 14 may be films made of a material of which a refractive index of a z-axis (a thickness direction) is greater than refractive indexes of an x-axis and a y-axis thereof.

The compensation layers 11 and 14 of the polarizer according to the exemplary embodiment may be positive C plates. In this case, thickness direction retardations of the compensation layers 11 and 14 for incident light of a wavelength of about 550 nm may be in a range of about −200 nm to about −25 nm. When the compensation layers 11 and 14 are the positive C plates, the retardation value Rth1 of the thickness direction may be calculated by the following Equation 1.

$$Rth1 = \left(\frac{nx+ny}{2} - nz\right) \times d \quad \text{(Equation 1)}$$

In Equation 1, d denotes a thickness of the compensation layer, nz denotes a refractive index of a thickness direction of the compensation layer, and nx and ny denote refractive indexes for two directions that are orthogonal to a plane that is perpendicular to a thickness direction of the compensation layer.

Alternatively, the compensation layers 11 and 14 of the polarizer according to the exemplary embodiment may be negative C plates. In this case, the thickness direction retardations of the compensation layers 11 and 14 for incident light of a wavelength of about 550 nm may be in a range of about 25 nm to about 200 nm. When the compensation layers 11 and 14 are the negative C plates, the retardation value Rth2 of the thickness direction may be calculated by the following Equation 2.

$$Rth2 = \left(nz - \frac{nx+ny}{2}\right) \times d \quad \text{(Equation 2)}$$

In Equation 2, d denotes a thickness of the compensation layer, nz denotes a refractive index of a thickness direction of the compensation layer, and nx and ny denote refractive indexes for two directions that are orthogonal to a plane that is perpendicular to a thickness direction of the compensation layer.

The compensation layers 11 and 14 are selected as the positive C plates or the negative C plate depending on the kind of the retardation layers 12 and 13. For example, when the retardation layers 12 and 13 are positive A plates, the compensation layers 11 and 14 are selected as positive C plates. Alternatively, when the retardation layers 12 and 13 are negative A plates, the compensation layers 11 and 14 are selected as negative C plates.

An in-plane retardation value (Re) of the compensation layers 11 and 14 may be calculated by the following Equation 3.

$$Re = (nx-ny) \times d \quad \text{(Equation 3)}$$

In Equation 3, d denotes a thickness of the compensation layer, and nx and ny denote refractive indexes for two directions that are orthogonal to a plane that is perpendicular to a thickness direction of the compensation layer. In the polarizer 100 according to the exemplary embodiment, in-plane retardation of the compensation layers 11 and 14 for incident light of a wavelength of about 550 nm may be in a range of about 0 nm to about 3 nm.

The thicknesses of the compensation layers 11 and 14 are not particularly limited, but for laminating the polarization layer 10, they may be in a range of about 0.1 µm to about 5 µm. For example, each thickness of the compensation layers 11 and 14 may be about 0.1 µm to 1.0 µm, 1.0 µm to 2.0 µm, 2.0 µm to 3.0 µm, 3.0 µm to 4.0 µm, and 4.0 µm to 5.0 µm. As another example, each thickness of the compensation layers 11 and 14 may be 0.1 µm, 0.2 µm, 0.3 µm, 0.4 µm, 0.5 µm, 0.6 µm, 0.7 µm, 0.8 µm, 0.9 µm, 1.0 µm, 1.1 µm, 1.2 µm, 1.3 µm, 1.4 µm, 1.5 µm, 1.6 µm, 1.7 µm, 1.8 µm, 1.9 µm, 2.0 µm, 2.1 µm, 2.2 µm, 2.3 µm, 2.4 µm, 2.5 µm, 2.6 µm, 2.7 µm, 2.8 µm, 2.9 µm, 3.0 µm, 3.1 µm, 3.2 µm, 3.3 µm, 3.4 µm, 3.5 µm, 3.6 µm, 3.7 µm, 3.8 µm, 3.9 µm, 4.0 µm, 4.1 µm, 4.2 µm, 4.3 µm, 4.4 µm, 4.5 µm, 4.6 µm, 4.7 µm, 4.8 µm, 4.9 µm, and 5.0 µm.

The compensation layers 11 and 14 may be combined with retardation layers 12 and 13 by lamination, coating, deposition, transfer, adhesion, pressure sensitive adhesion (PSA), or the like.

The first retardation layer 12 may be positioned on the first compensation layer 11, and the second retardation layer 13 may be positioned on the second compensation layer 14.

For example, the positive C plate may be coated on one surface of the first retardation layer 12, and the positive C plate may be coated on one surface of the second retardation layer 13. In addition, one surface of the first retardation layer 12 on which the positive C plate is coated and another surface of the second retardation layer 13 may be combined with each other. In this case, one surface of the first retardation layer 12 on which the positive C plate is coated and another surface of the second retardation layer 13 may be combined with each other by adhesion, pressure sensitive adhesion (PSA), lamination, or the like.

As the retardation layers 12 and 13 are typically used in the polarizer for the display device, films having a retardation function may be used without limitation. With the retardation layers 12 and 13, a film made of an acrylic-based material, a polycarbonate-based material, a polystyrene-based material, a polyimide-based material, a cellulose-based material, an olefin-based material, a cycloolefin polymer-based material, or a mixture thereof, may be used. Preferably, a film made of an acrylic-based material, a polycarbonate-based material, or a cycloolefin polymer-based material may be used.

In the polarizer 100 of the exemplary embodiment, a thickness direction retardation of the retardation layer 12 corresponding to the positive A plate may be in a range of about 110 nm to about 140 nm. A thickness direction retardation of the retardation layer 13 corresponding to the positive A plate may be in a range of about 50 nm to about 80 nm. The thickness direction retardation of the polarizer 100 may increase by the thickness direction retardation of the first retardation layer 12 and the second retardation layer 13. Since the thickness direction retardation of the compensation layers 11 and 14 corresponding to the positive C plate may be in a range of about −200 nm to about −25 nm, the thickness direction retardation of the polarizer 100 may decrease by laminating the compensation layers 11 and 14.

In the polarizer 100 of the exemplary embodiment, a thickness direction retardation of the retardation layer 12 corresponding to the negative A plate may be in a range of about −140 nm to about −110 nm. A thickness direction retardation of the retardation layer 13 corresponding to the negative A plate may be in a range of about −80 nm to about −50 nm. The thickness direction retardation of the polarizer 100 may increase in a negative direction by the thickness direction retardation of the first retardation layer 12 and the second retardation layer 13. Since the thickness direction retardation of the compensation layers 11 and 14 corresponding to the negative C plate may be in a range of about 25 nm to about 200 nm, the thickness direction retardation of the polarizer 100 may decrease by laminating the compensation layers 11 and 14.

When the compensation layers 11 and 14 for compensating the thickness direction retardation of the retardation layers 12 and 13 are laminated, the thickness direction retardation of the polarizer 100 may decrease. Thus, a characteristic difference according to a viewing angle may decrease. Accordingly, a side viewing angle of the polarizer 100 according to the exemplary embodiment may be improved.

The polarizer 100 of FIG. 1 may be used in a display device. In particular, the polarizer 100 may be used in a flat panel display such as a light emitting display, a liquid crystal display, or the like. This will be described later with reference to FIG. 16 and FIG. 17.

Now, a reflection ratio for each viewing angle of the polarizer according to examples and comparative examples will be described in detail with reference to FIG. 2, FIG. 3, FIG. 4, FIG. 5, FIG. 6, FIG. 7, and FIG. 8.

Figure 2:
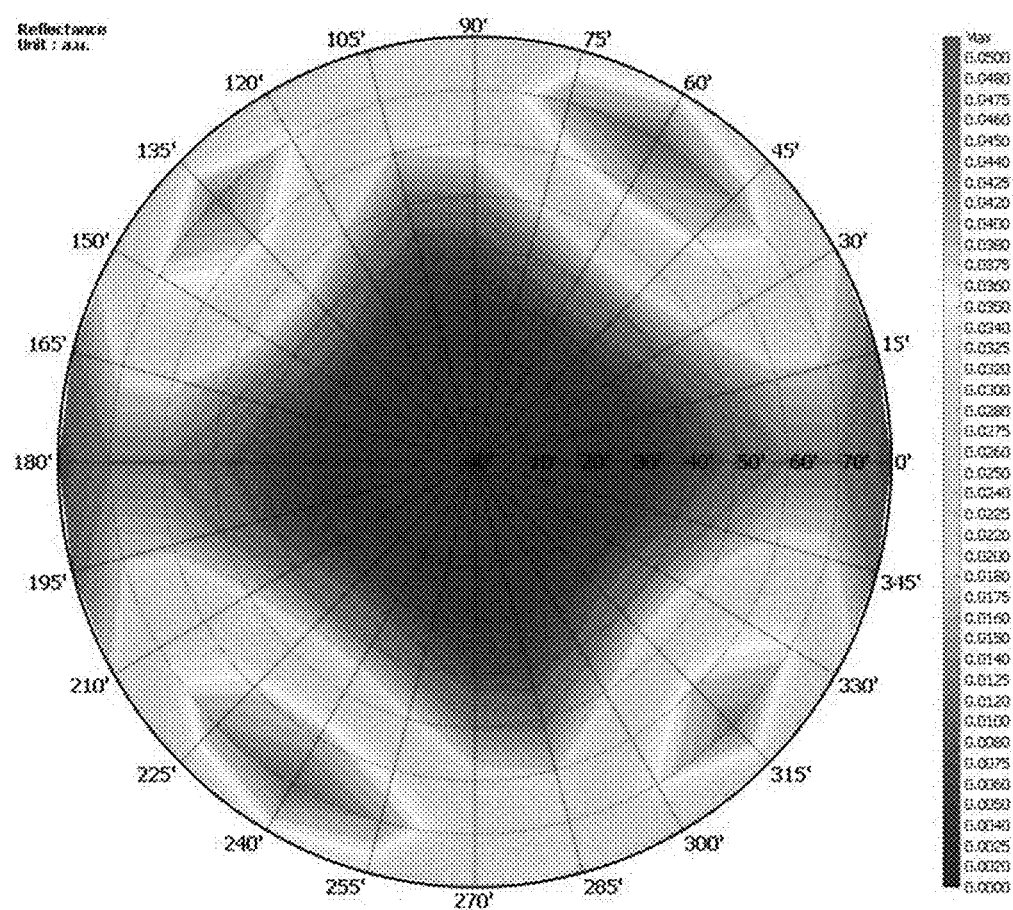
FIG. 2 illustrates a reflection ratio distribution for each viewing angle of a polarizer of a first comparative example.
Figure 3:
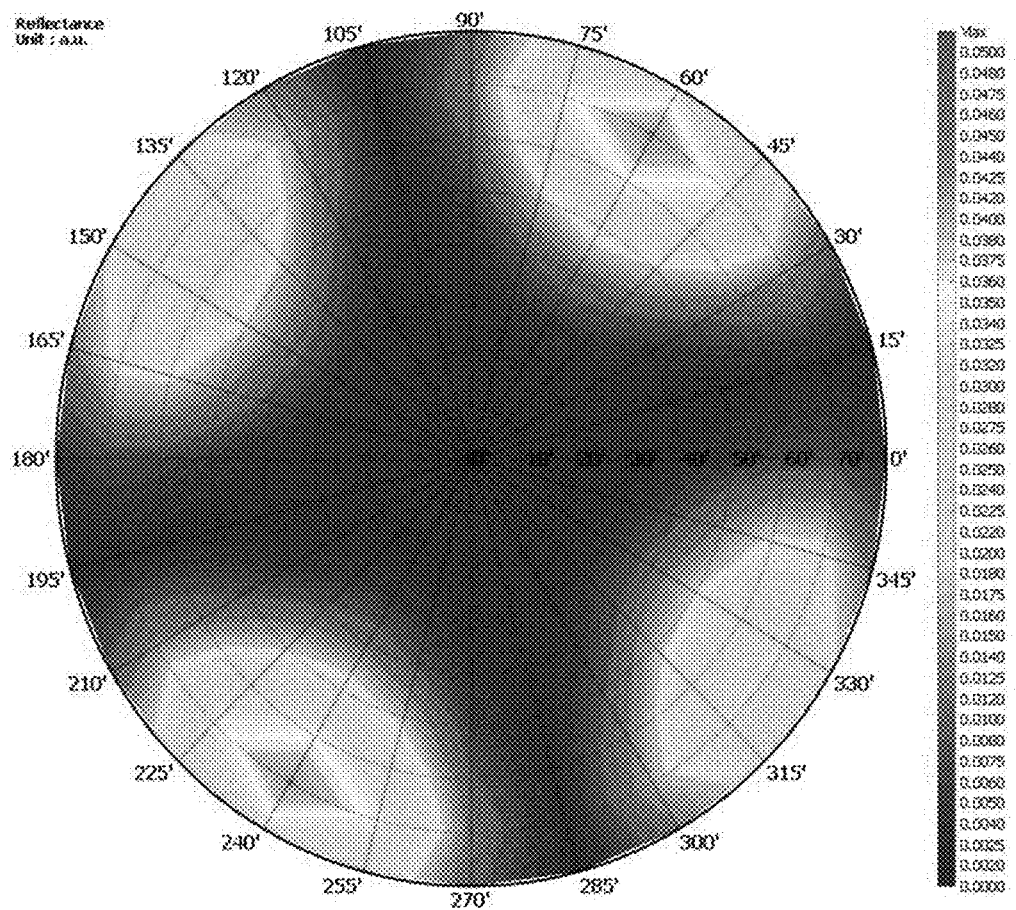
FIG. 3 illustrates a reflection ratio distribution for each viewing angle of a polarizer of a second comparative example.
Figure 4:
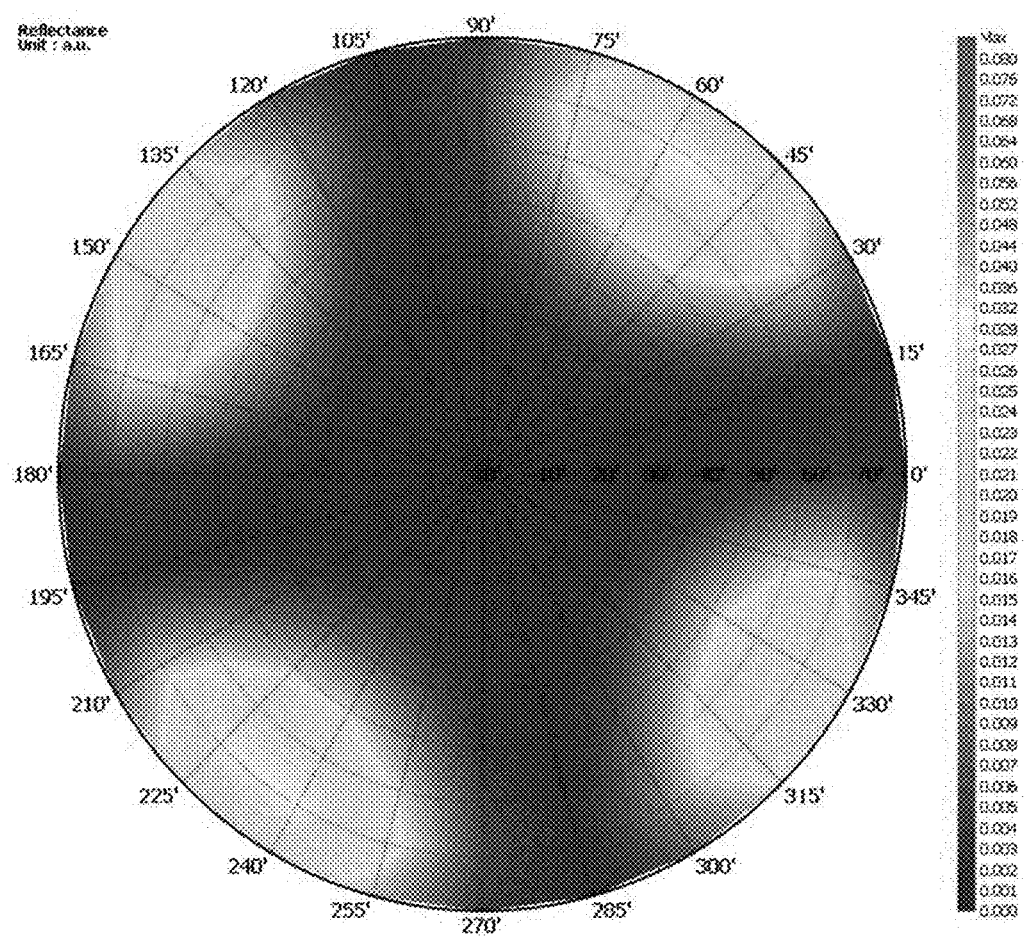
FIG. 4, FIG. 5, FIG. 6, FIG. 7, and FIG. 8 respectively illustrate a reflection ratio distribution for each viewing angle of polarizers according to a first, second, third, fourth, and fifth aspect of an exemplary embodiment.
Figure 5:
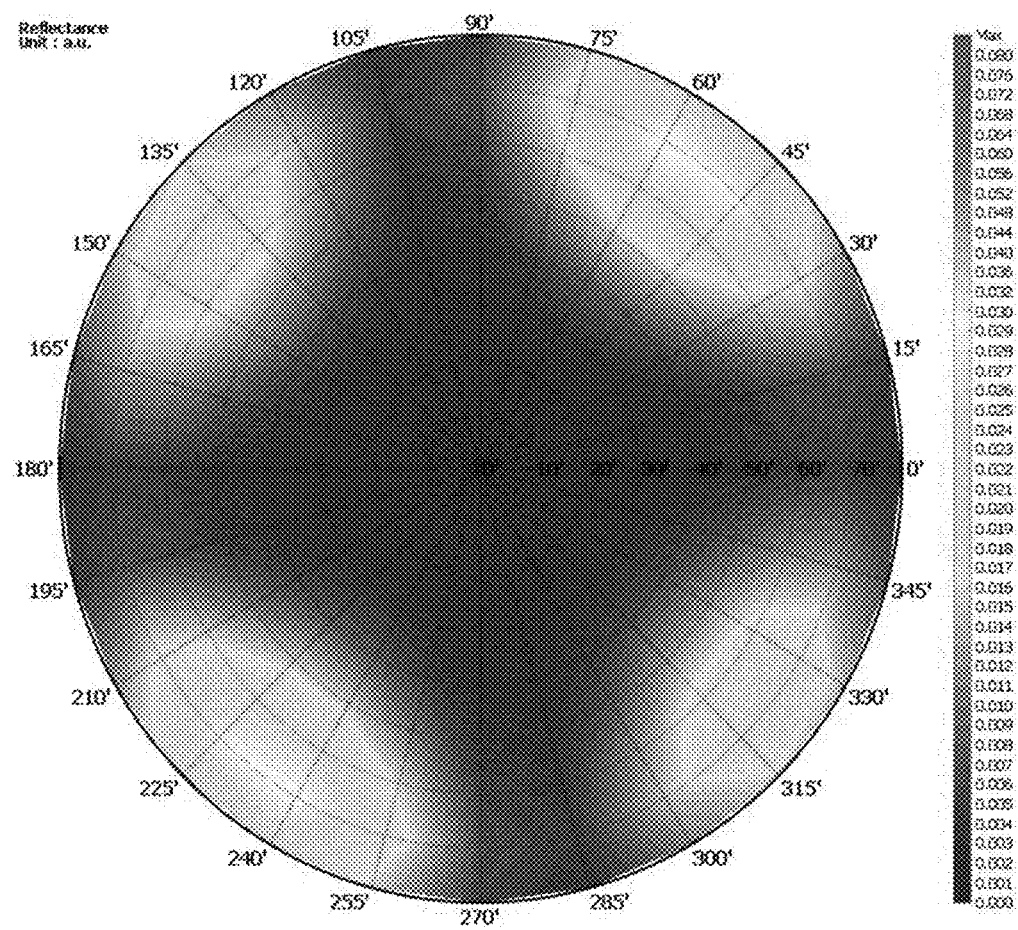
Figure 6:
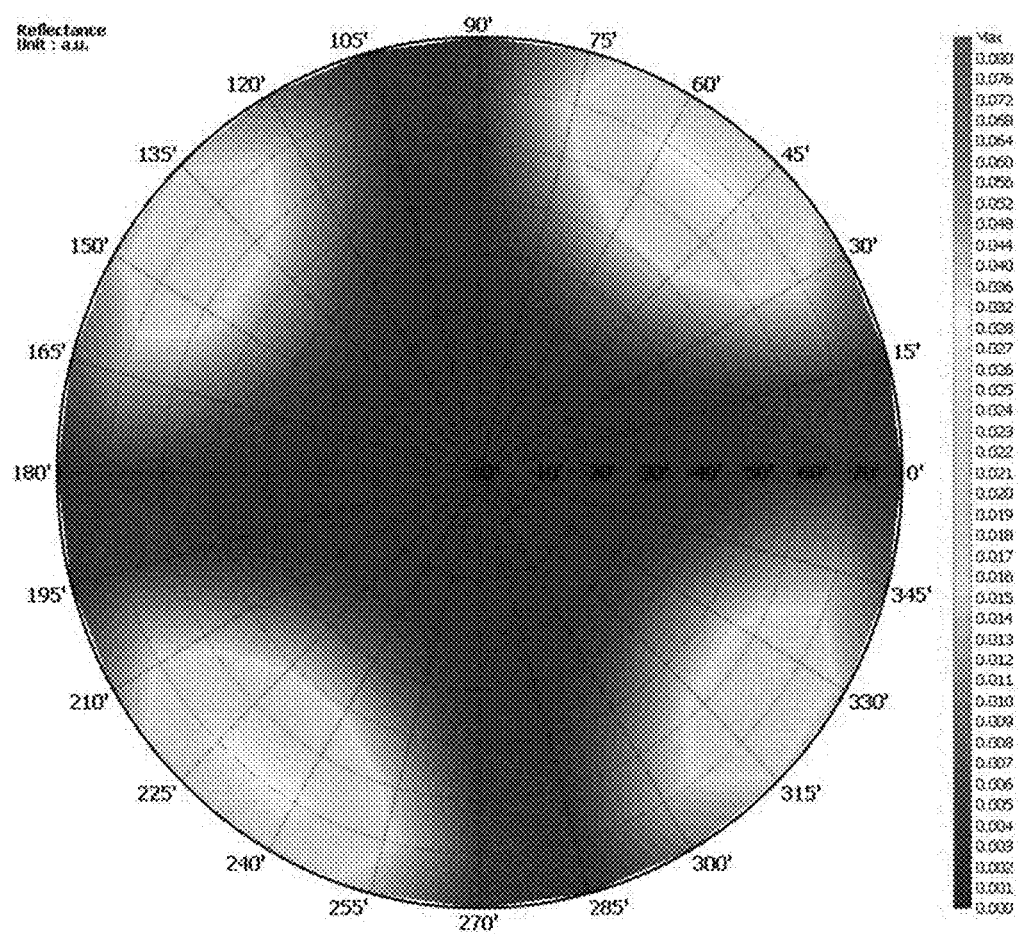
Figure 7:
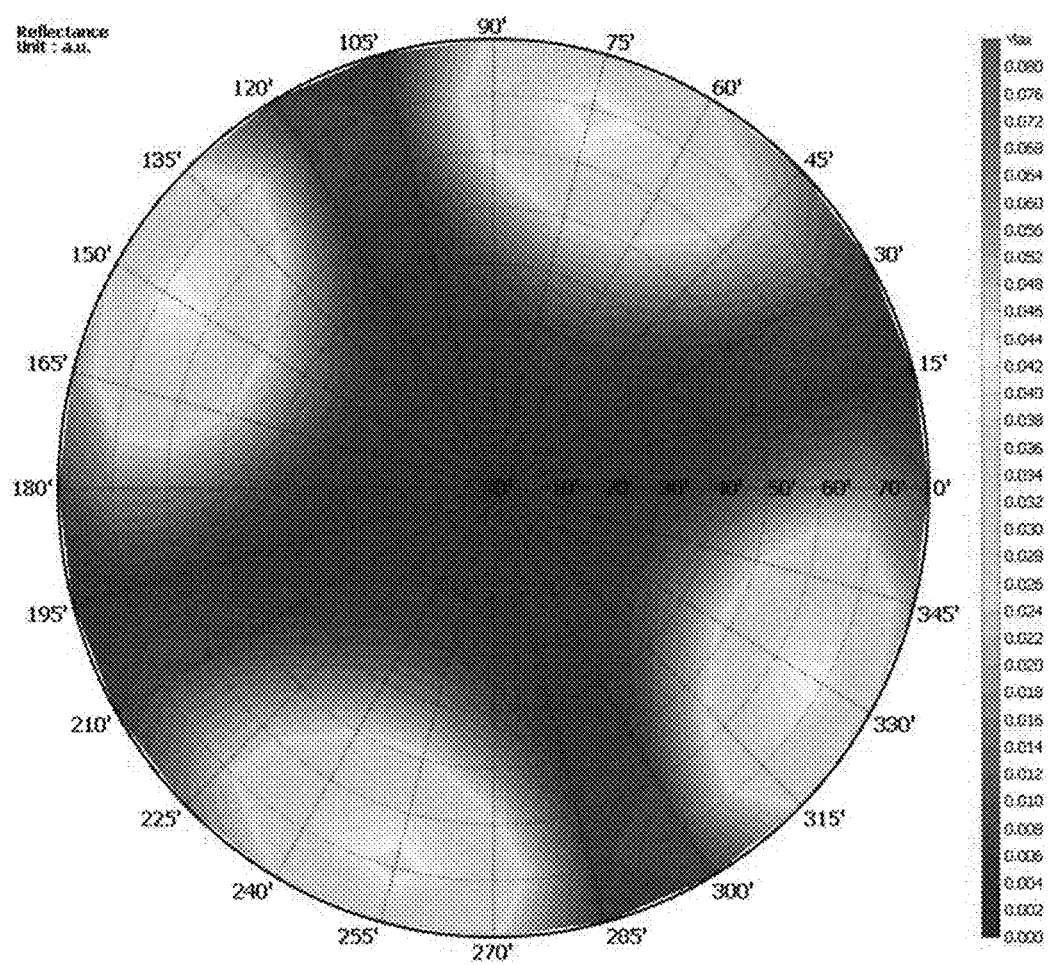
Figure 8:
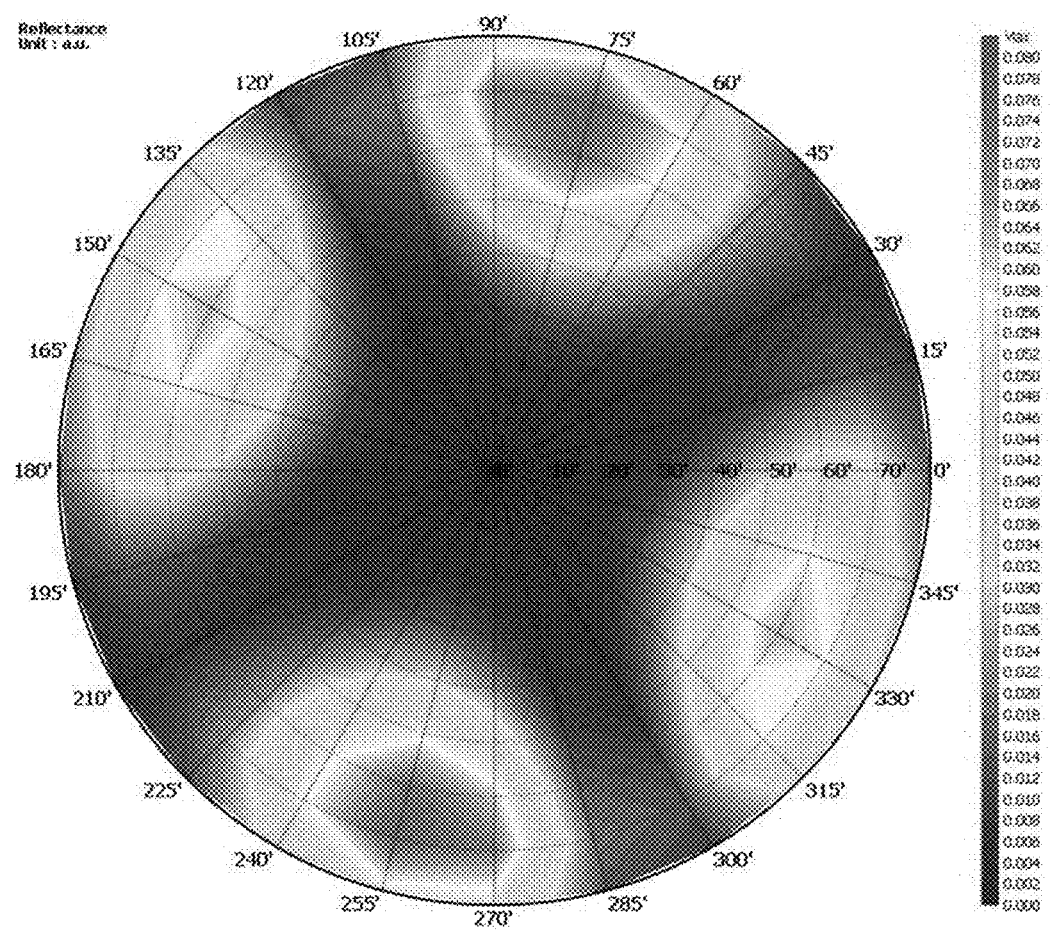

FIG. 2 illustrates a reflection ratio distribution for each viewing angle of a polarizer of a first comparative example, FIG. 3 illustrates a reflection ratio distribution for each viewing angle of a polarizer of a second comparative example, and FIGS. 4 8 respectively illustrate a reflection ratio distribution for each viewing angle of polarizers according to a first, second, third, fourth, and fifth aspect of an exemplary embodiment.

The polarizer according to the first comparative example is a structure without the compensation layers 11 and 14 in FIG. 1, and the polarizer according to the second comparative example is a structure without the first compensation layer 11 in FIG. 1.

In each polarizer 100 of the first to fifth aspects and the first and second comparative examples, a thickness of the polarization layer 10 may be about 31 μm, a thickness of the first retardation layer 12 may be about 1.92 μm, and a thickness of the second retardation layer 13 may be about 0.96 μm.

In each polarizer 100 of the first to fifth aspects and the first and second comparative examples, the in-plane retardation of the first retardation layer 12 for the incident light of the wavelength of about 550 nm may be 240 nm, and the thickness direction retardation thereof for the incident light of the wavelength of about 550 nm may be about 120 nm.

In each polarizer 100 of the first to fifth aspects and the first and second comparative examples, the short-wavelength dispersion value of the first retardation layer 12 may be about 1.10, and the long-wavelength dispersion value thereof may be about 0.95.

In each polarizer 100 of the first to fifth aspects and the first and second comparative examples, the in-plane retardation of the first retardation layer 12 for the incident light of the wavelength of about 550 nm may be about 120 nm, and the thickness direction retardation thereof for the incident light of the wavelength of about 550 nm may be about 60 nm.

In each polarizer 100 of the first to fifth aspects and the first and second comparative examples, the short-wavelength dispersion value of the second retardation layer 13 may be about 1.10, and the long-wavelength dispersion value may be about 0.95.

The compensation layer may be designed so that the thickness direction retardation of the compensation layer included in the polarizer of the second comparative example for the incident light of the wavelength of about 550 nm may be about −60 nm.

The polarizer 100 according to the exemplary embodiment has the structure shown in FIG. 1. The thickness direction retardation of the first compensation layer 11 of the polarizer 100 has a predetermined ratio with respect to the thickness direction retardation of the first retardation layer 12. The predetermined ratio may vary depending on design, thus it is not limited to a specific value. In addition, the thickness direction retardation of the second compensation layer 14 of the polarizer 100 has a predetermined ratio with respect to the thickness direction retardation of the second retardation layer 13. The predetermined ratio may vary depending on design, thus it is not limited to a specific value, and specifically, the predetermined ratio may be in a ratio range of about 0.25 times to about 3 times.

The polarizer 100 according to the first aspect may be designed so that the thickness direction retardation of the first compensation layer 11 is the same as the thickness direction retardation of the first retardation layer 12. For example, in the first compensation layer 11 of the polarizer 100 according to the first aspect, the thickness direction retardation for the incident light of the wavelength of about 550 nm may be about −120 nm.

In addition, the polarizer 100 according to the first aspect may be designed so that the thickness direction retardation of the second compensation layer 14 is the same as the thickness direction retardation of the second retardation layer 13. For example, in the second compensation layer 14 of the polarizer 100 according to the first aspect, the thickness direction retardation for the incident light of the wavelength of about 550 nm may be about −60 nm.

The polarizer 100 according to the second aspect may be designed so that the thickness direction retardation of the first compensation layer 11 has about ¼ the thickness direction retardation of the first retardation layer 12. For example, in the polarizer 100 according to the second aspect, the thickness direction retardation of the first compensation layer 11 for the incident light of the wavelength of about 550 nm may be about −30 nm.

In addition, the polarizer 100 according to the second aspect may be designed so that the thickness direction retardation of the second compensation layer 14 is the same as the thickness direction retardation of the second retardation layer 13. For example, in the second compensation layer 14 of the polarizer 100 according to the second aspect, the thickness direction retardation for the incident light of the wavelength of about 550 nm may be about −60 nm.

The polarizer 100 according to the third aspect may be designed so that the thickness direction retardation of the first compensation layer 11 has about one-half the thickness direction retardation of the first retardation layer 12. For example, in the polarizer 100 according to the third aspect, the thickness direction retardation of the first compensation layer 11 for the incident light of the wavelength of about 550 nm may be about −60 nm.

In addition, the polarizer 100 according to the third aspect may be designed so that the thickness direction retardation of the second compensation layer 14 is the same as the thickness direction retardation of the second retardation layer 13. For example, in the second compensation layer 14 of the polarizer 100 according to the second aspect, the thickness direction retardation for the incident light of the wavelength of about 550 nm may be about −60 nm.

The polarizer 100 according to the fourth aspect may be designed so that the thickness direction retardation of the first compensation layer 11 has about two times the thickness direction retardation of the first retardation layer 12. For example, in the polarizer 100 according to the fourth aspect, the thickness direction retardation of the first compensation layer 11 for the incident light of the wavelength of about 550 nm may be about −240 nm.

In addition, the polarizer 100 according to the fourth aspect may be designed so that the thickness direction retardation of the second compensation layer 14 is the same as the thickness direction retardation of the second retardation layer 13. For example, in the second compensation layer 14 of the polarizer 100 according to the fourth aspect, the thickness direction retardation for the incident light of the wavelength of about 550 nm may be about −60 nm.

The polarizer 100 according to the fifth aspect may be designed so that the thickness direction retardation of the first compensation layer 11 has about three times the thickness direction retardation of the first retardation layer 12. For example, in the polarizer 100 according to the fifth aspect, the thickness direction retardation of the first compensation layer 11 for the incident light of the wavelength of about 550 nm may be about −360 nm.

In addition, the polarizer 100 according to the fifth aspect may be designed so that the thickness direction retardation of the second compensation layer 14 is the same as the thickness direction retardation of the second retardation layer 13. For example, in the second compensation layer 14 of the polarizer 100 according to the fifth aspect, the thickness direction retardation for the incident light of the wavelength of about 550 nm may be about −60 nm.

According to the first aspect to the third aspect of the exemplary embodiment, the first comparative example, and the second comparative example, reflection ratios at tilt angles of 45 and 60 degrees are shown in Table 1.

TABLE 1

|  | Tilt angle | | | |
| --- | --- | --- | --- | --- |
|  | 45° | | 60° | |
| Azimuthal angle | 45° | 135° | 45° | 135° |
| First comparative example | 10.90 | 9.81 | 23.66 | 21.20 |
| Second comparative example | 7.07 | 5.74 | 18.57 | 15.62 |
| First aspect | 6.32 | 5.18 | 16.98 | 16.23 |
| Second aspect | 6.47 | 5.07 | 17.51 | 14.98 |
| Third aspect | 6.41 | 5.00 | 17.21 | 14.79 |

As shown in Table 1 and FIGS. 2 to 8, when the polarizers 100 of the exemplary embodiments are compared to those of the comparative examples, the reflection ratios of the polarizers 100 of the exemplary embodiments at the tilt angles of 45 and 60 degrees are relatively low, thereby improving the side viewing angle.

Specifically, when the polarizers 100 of the first aspect to the third aspect of the exemplary embodiment are compared to those of the comparative examples, the reflection ratios of the polarizers 100 of the first aspect to the third aspect at the tilt and azimuthal angles of 45 degrees, which are respectively 6.32, 6.47, and 6.41, are lower than those of the first and second comparative examples, which are respectively 10.90 and 7.07.

In addition, when the polarizers 100 of the first aspect to the third aspect of the exemplary embodiment are compared to those of the comparative examples, the reflection ratios of the polarizers 100 of the first aspect to the third aspect at the tilt of 45 degrees and at the azimuthal angle of 135 degrees, which are respectively 5.18, 5.07, and 5.00, are lower than those of the first and second comparative examples, which are respectively 9.81 and 5.74.

When the polarizers 100 of the first aspect to the third aspect of the exemplary embodiment are compared to those of the comparative examples, the reflection ratios of the polarizers 100 of the first aspect to the third aspect at the tilt of 60 degrees and at the azimuthal angle of 45 degrees, which are respectively 16.98, 17.51, and 17.21, are lower than those of the first and second comparative examples, which are respectively 23.66 and 18.57.

In addition, when the polarizers 100 of the first aspect to the third aspect of the exemplary embodiment are compared to those of the comparative examples, the reflection ratios of the polarizers 100 of the first aspect to the third aspect at the tilt of 60 degrees and at the azimuthal angle of 135 degrees, which are respectively 16.23, 14.98, and 14.79, are lower than those of the first and second comparative examples, which are respectively 21.20 and 15.62.

Accordingly, in view of a reflection ratio for each viewing angle, the polarizers 100 of the first aspect to the third aspect of the exemplary embodiment may be superior to the polarizers of the comparative examples.

Hereinafter, a color shift for each viewing angle of the polarizers according to an exemplary embodiment and comparative examples will be described in detail with reference to FIGS. 9 to 15.

Figure 9:
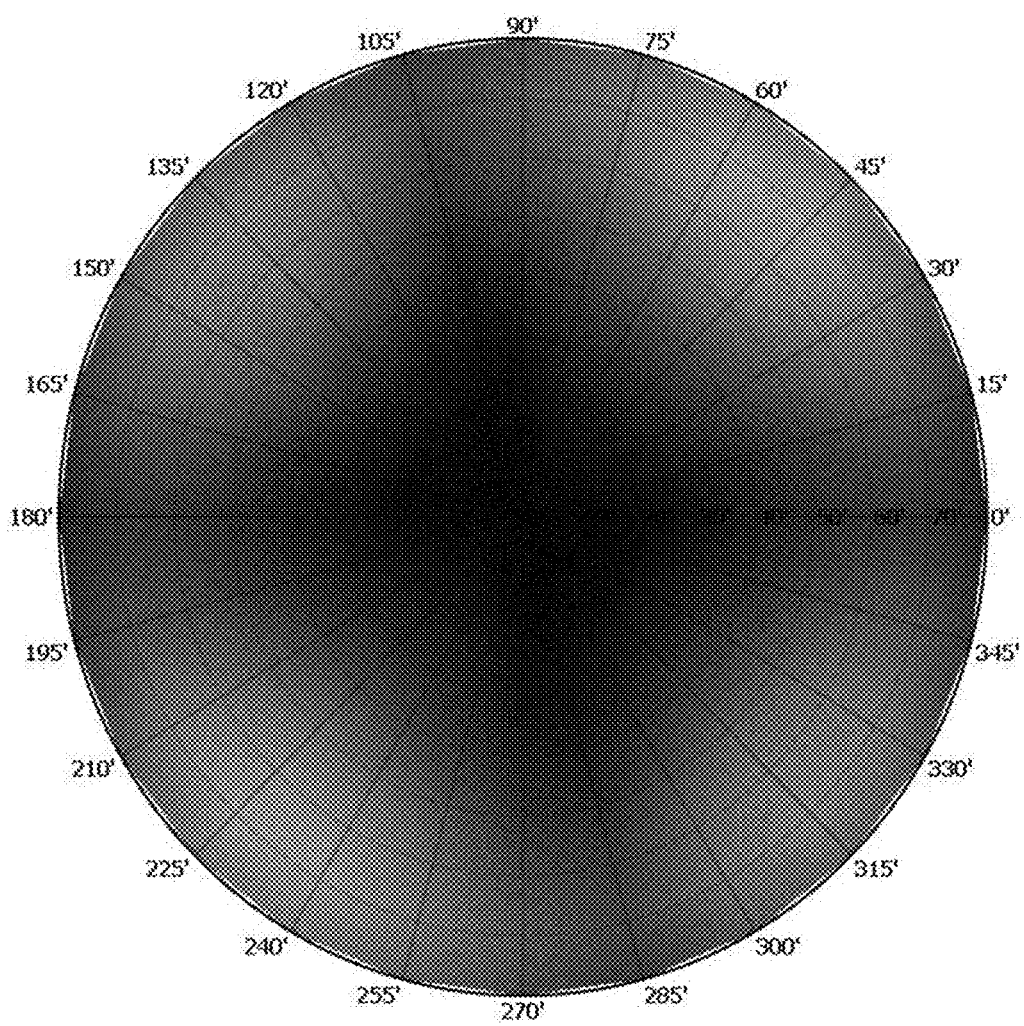
FIG. 9 illustrates a color shift distribution for each viewing angle of a polarizer of a first comparative example.
Figure 10:
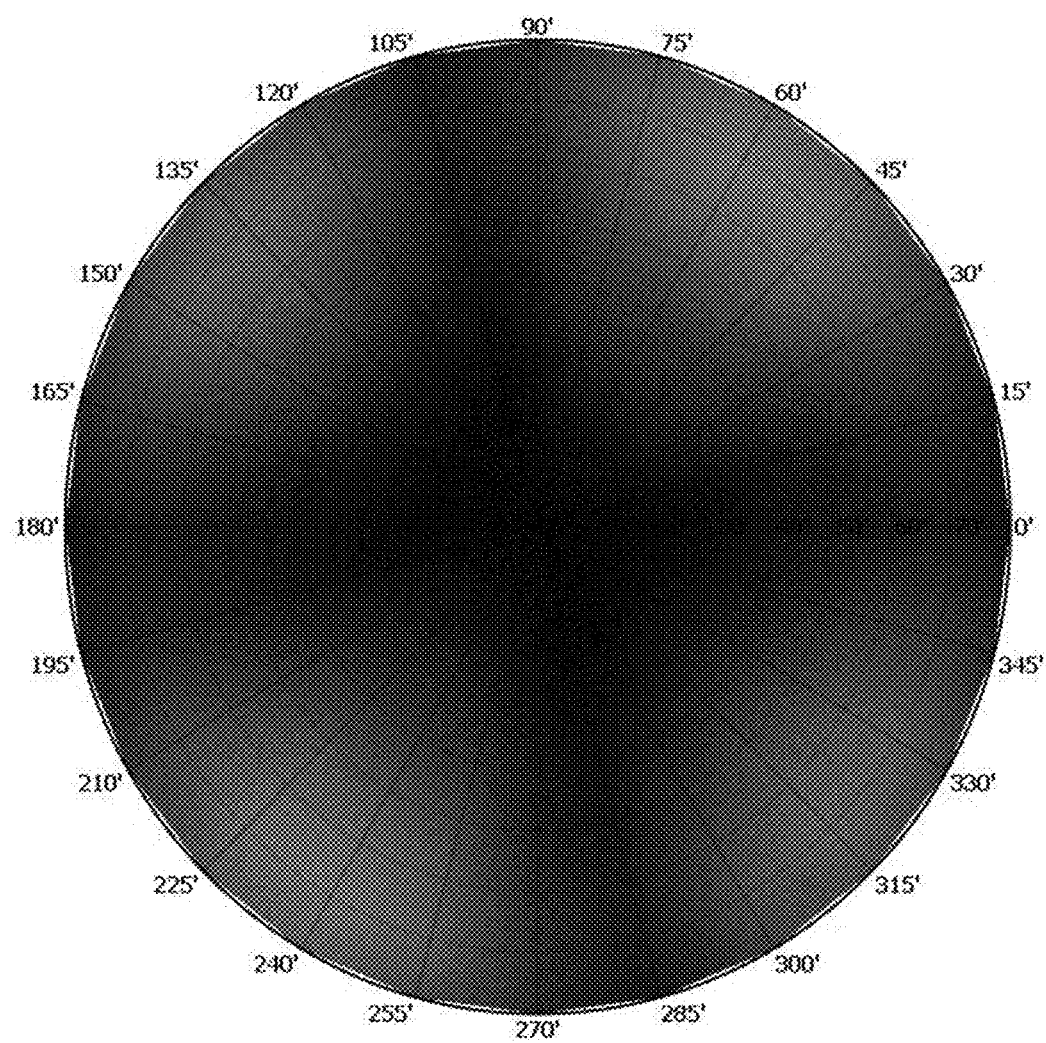
FIG. 10 illustrates a color shift distribution for each viewing angle of a polarizer of a second comparative example.
Figure 11:
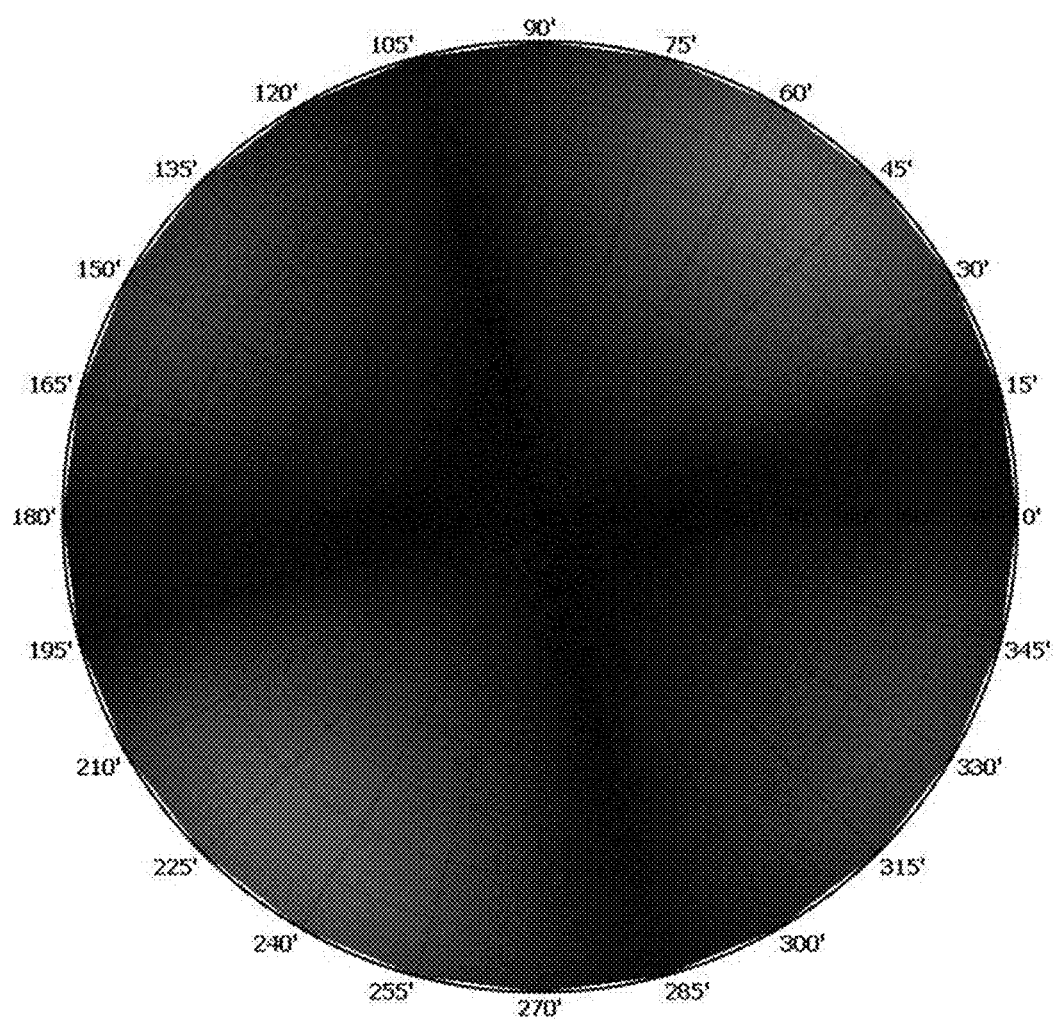
FIG. 11, FIG. 12, FIG. 13, FIGS. 14, and 15 respectively illustrate a reflection ratio distribution for each viewing angle of polarizers according to first, second, third, fourth, and fifth aspect of an exemplary embodiment.
Figure 12:
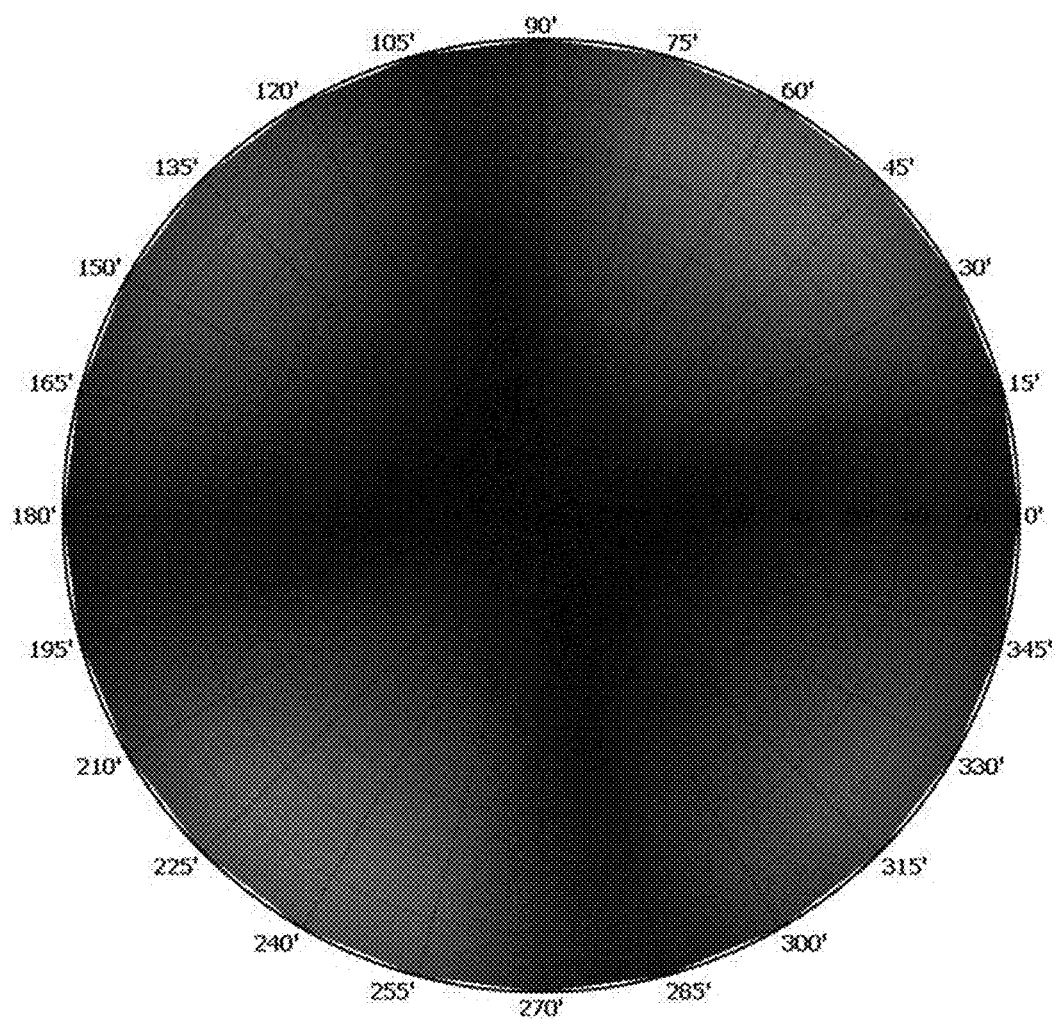
Figure 13:
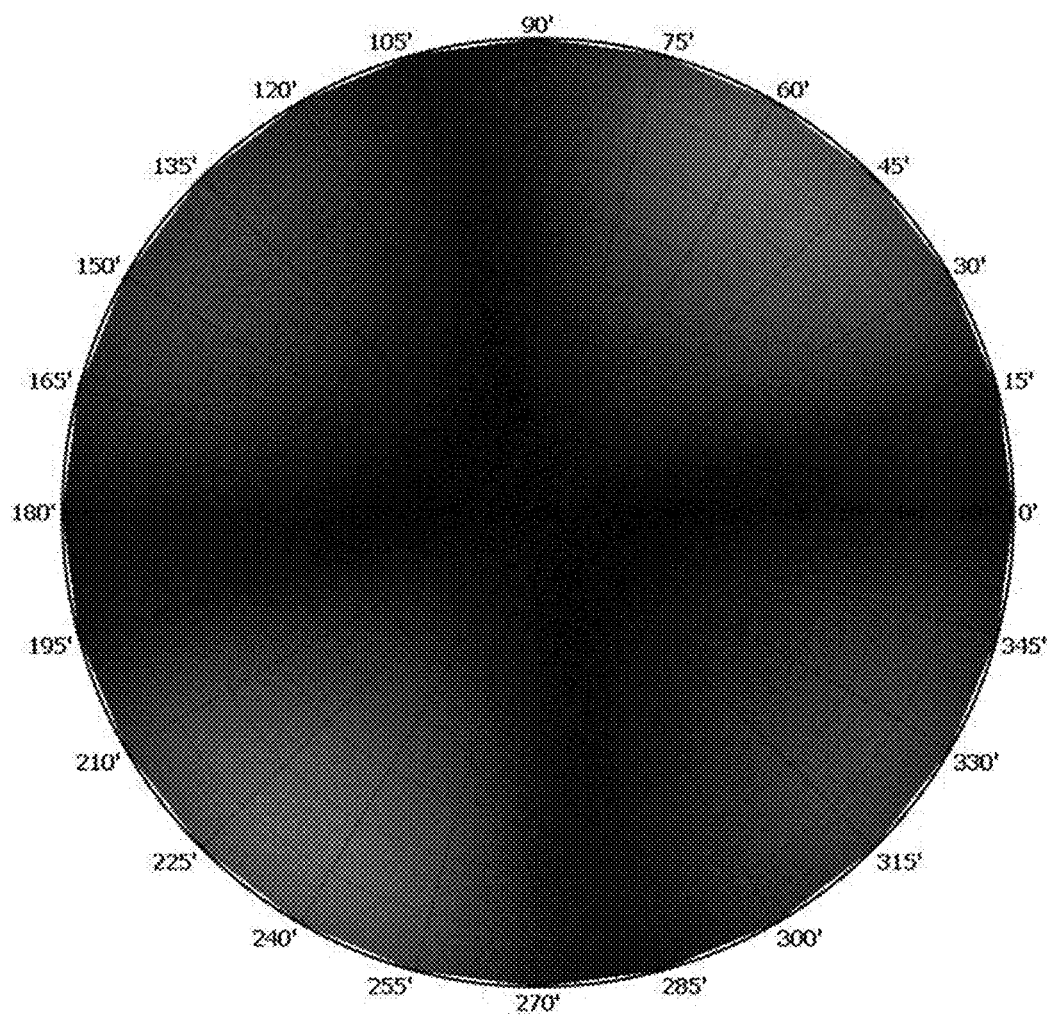
Figure 14:
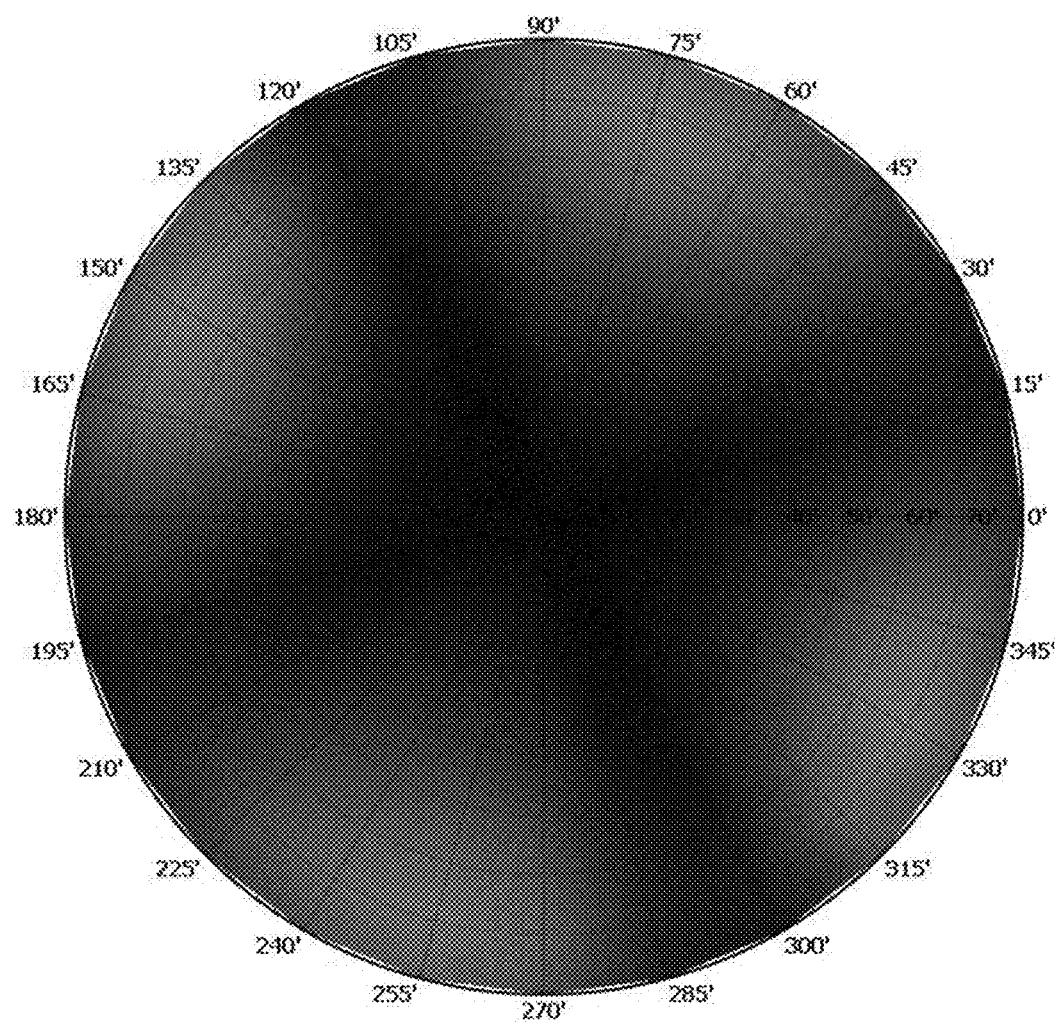
Figure 15:
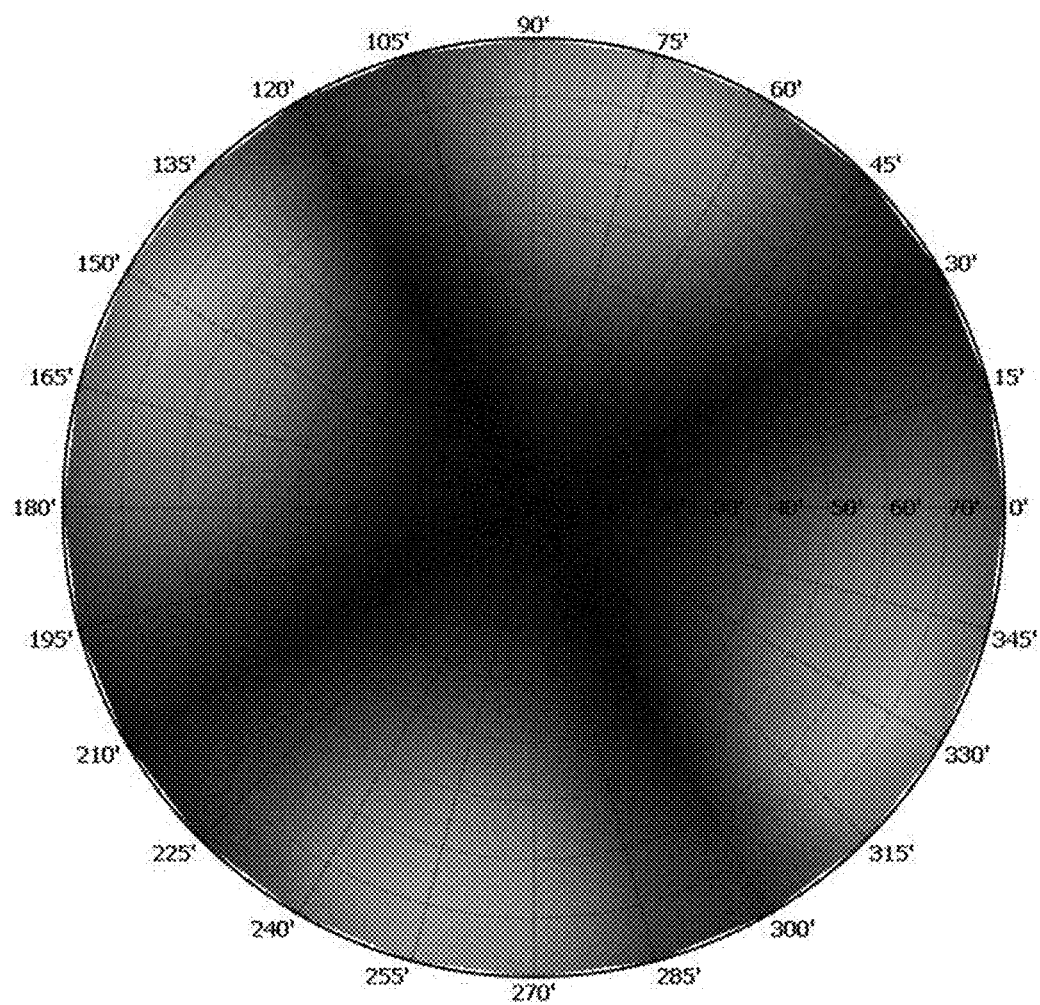

FIG. 9 illustrates a color shift distribution for each viewing angle of a polarizer of a first comparative example, and FIG. 10 illustrates a color shift distribution for each viewing angle of a polarizer of a second comparative example.

FIGS. 11 to 15 respectively illustrate a reflection ratio distribution for each viewing angle of polarizers according to a first aspect to a fifth aspect of an exemplary embodiment.

A value of the color shift may be calculated by using an "a" value of a horizontal axis and a "b" value of a vertical axis in a CIELAB color coordinate system, and a positive "a" value represents red, a negative "a" value represents green, a positive "b" value represents yellow, and a negative "b" value represents blue.

The value (ΔE) of the color shift may be calculated by the following Equation 4.

$$\Delta E = \sqrt{\Delta a^2 + \Delta b^2} \qquad \text{(Equation 4)}$$

In Equation 4, ΔE denotes a color shift value, Δa denotes a deviation of the "a" value in the CIE color coordinate system, and Δb denotes a deviation of the "b" value in the CIE color coordinate system. The color shift is better as ΔE becomes smaller.

According to the first aspect to the fifth aspect of the exemplary embodiment, the first comparative example, and the second comparative example, Δ Es at the tilt angles of 45 and 60 degrees are shown in Table 2.

TABLE 2

| Tilt angle | 45° | 60° |
| --- | --- | --- |
| First comparative example | 16.32 | 15.57 |
| Second comparative example | 15.54 | 13.52 |
| First aspect | 12.49 | 10.49 |
| Second aspect | 14.58 | 13.81 |
| Third aspect | 14.58 | 13.41 |
| Fourth aspect | 5.68 | 6.02 |
| Fifth aspect | 1.21 | 10.91 |

As shown in Table 2 and FIGS. 9 to 15, when the polarizer 100 of the exemplary embodiment is compared to those of the comparative examples, the color shift values of the polarizer 100 of the exemplary embodiment at the tilt angles of 45 and 60 degrees are relatively low, thereby improving the side viewing angle. Herein, Δ E of the first comparative example, the second comparative example, and the first aspect to the third aspect is calculated based on the values measured at the azimuthal angles of 45 and 135 degrees, and Δ E of the fourth and fifth aspects is calculated based on the values measured at the azimuthal angles of 60 and 150 degrees.

Specifically, when the polarizers 100 of the first aspect to the fifth aspect of the exemplary embodiment are compared to those of the comparative examples, the color shift values of the polarizers 100 of the first aspect to the fifth aspect at the tilt angle of 45 degrees, which are respectively 12.49, 14.58, 14.58, 5.68, and 1.21, are lower than those of the first comparative example and the second comparative example, which are 16.32 and 15.54.

In addition, when the polarizers 100 of the first aspect to the fifth aspect of the exemplary embodiment are compared to those of the comparative examples, the color shift values of the polarizers 100 of the first aspect to the fifth aspect at the tilt angle of 60 degrees, which are respectively 10.49, 13.81, 13.41, 6.02, and 10.91, are lower than those of the first comparative example and the second comparative example, which are 15.57 and 13.52.

Accordingly, when the polarizers 100 of the first aspect to the fifth aspect of the exemplary embodiment are compared to those of the comparative examples, the color shift values of the polarizers 100 of the first aspect to the fifth aspect are relatively low, thereby improving the side viewing angle.

Hereinafter, a display device in which the polarizer 100 of the exemplary embodiment is laminated will be described with reference to FIG. 16 and FIG. 17.

Figure 16:
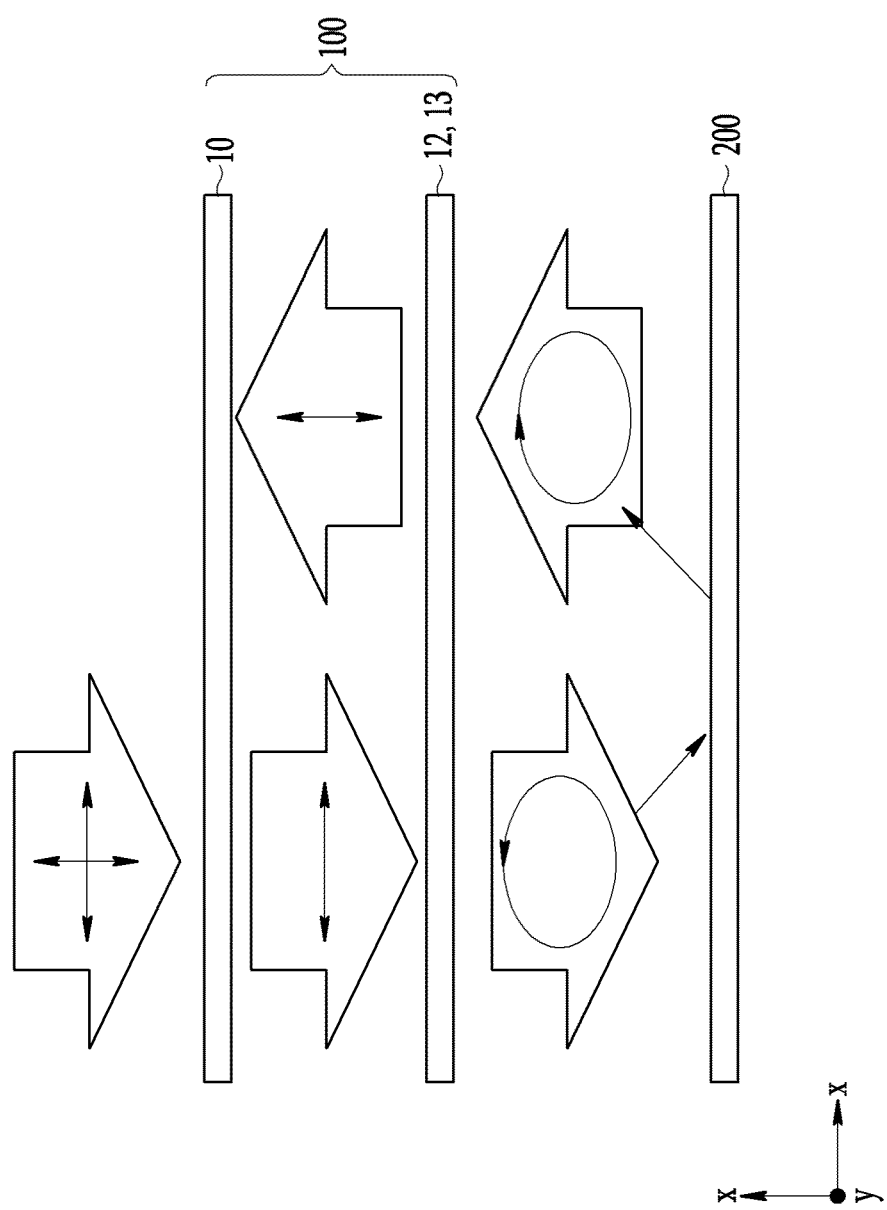
FIG. 16 illustrates a schematic view for explaining an antireflective principle of a polarizer according to an exemplary embodiment.
Figure 17:
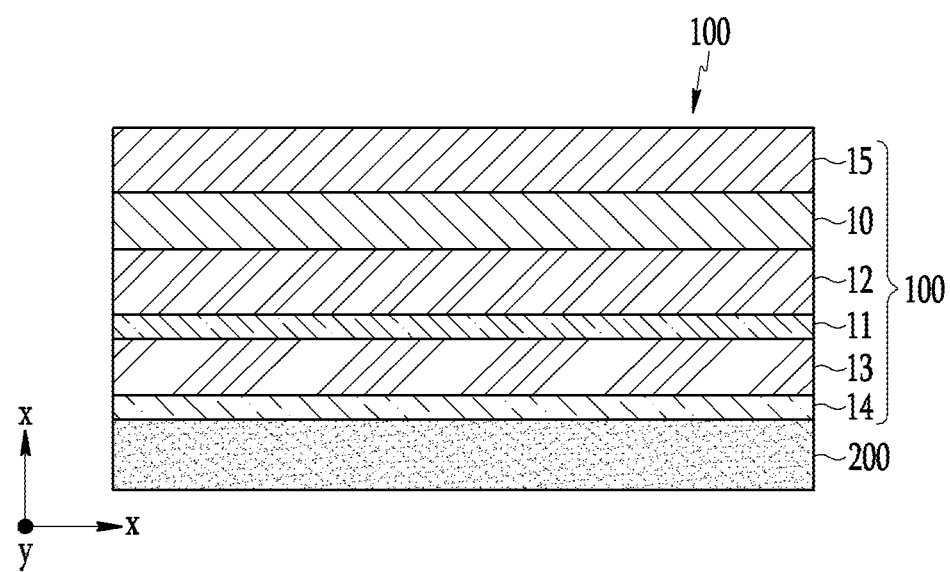
FIG. 17 illustrates a cross-sectional view of a display device including a polarizer according to an exemplary embodiment.

FIG. 16 illustrates a schematic view for explaining an antireflective principle of the polarizer 100 according to the exemplary embodiment, and FIG. 17 illustrates a cross-sectional view of a display device including the polarizer 100 according to the exemplary embodiment.

As shown in FIG. 16 and FIG. 17, the display device includes an organic light emitting panel 200 and a polarizer 100 positioned on one surface of the organic light emitting panel 200.

As shown in FIG. 16, while non-polarized external incident light passes through the polarization layer 10, only one of two polarized perpendicular components may be transmitted. While the polarized light passes through the retardation layers 12 and 13, the polarized light may be shifted into circularly polarized light.

While the circularly polarized light is reflected on the light emitting display panel 200, including a substrate, an electrode, and so on, its circular polarization direction may be changed. While the circularly polarized light of which circular polarization direction is changed passes through the retardation layers 12 and 13 again, only one of the two polarized perpendicular components may be transmitted.

One of the two polarized perpendicular components does not pass through the polarization layer 10, thus light is not emitted outside, thereby preventing the external light from being reflected.

The polarizer 100 shown in FIG. 17 includes the polarization layer 10, the retardation layers 12 and 13, the compensation layers 11 and 14, and the passivation layer 15. Since the polarizer 100 is the same as that of FIG. 1, a detailed description thereof will be omitted.

The polarizer 100 and the display device including the same according to the exemplary embodiment reduce the reflection ratio, and thus decrease dependence on the viewing angle.

In addition, the polarizer 100 and the display device including the same according to the exemplary embodiment have an excellent color shift prevention characteristic, and thus decrease dependence on the viewing angle.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A polarizer, comprising:
   a first retardation layer and a second retardation layer having different retardation values with respect to each other;
   a polarization layer disposed on the first retardation layer;
   a first compensation layer disposed between the first retardation layer and the second retardation layer; and
   a second compensation layer disposed below the second retardation layer,
   wherein each thickness of the first retardation layer and the second retardation layer is in a range of about 0.1 μm to about 4 μm.

2. The polarizer of claim 1,
   wherein a thickness direction retardation of the first compensation layer is the same as that of the second compensation layer.

3. The polarizer of claim 1, wherein a thickness direction retardation of the first compensation layer is equal to or greater than about 0.25 times that of the first retardation layer and equal to or less than about three times that of the first retardation layer.

4. The polarizer of claim 3, wherein a thickness direction retardation of the second compensation layer is equal to or greater than about 0.25 times that of the second retardation layer, and equal to or less than about three times that of the first retardation layer.

5. The polarizer of claim 3, wherein the first retardation layer has $\lambda/2$ retardation and the second retardation layer has $\lambda/4$ retardation.

6. The polarizer of claim 5, wherein in-plane retardation of the first retardation layer for incident light of a wavelength of about 550 nm is in a range of about 220 nm to about 270 nm, a short-wavelength dispersion value of the first retardation layer is in a range of about 0.90 to about 1.20, and a long-wavelength dispersion value of the first retardation layer is in a range of about 0.90 to about 1.20.

7. The polarizer of claim 6, wherein in-plane retardation of the second retardation layer for the incident light of the wavelength of about 550 nm is in a range of about 110 nm to about 150 nm, a short-wavelength dispersion value of the second retardation layer is in a range of about 0.90 to about 1.20, and a long-wavelength dispersion value of the second retardation layer is in a range of about 0.90 to about 1.20.

8. The polarizer of claim 1, wherein a thickness of the polarization layer is in a range of about 1 μm to about 200 μm.

9. A display device, comprising:
   a display panel; and
   a polarizer disposed on the display panel,
   wherein the polarizer comprises:
   a first retardation layer and a second retardation layer having different retardation values with respect to each other;
   a polarization layer disposed on the first retardation layer;
   a first compensation layer disposed between the first retardation layer and the second retardation layer; and
   a second compensation layer disposed below the second retardation layer,
   wherein each thickness of the first retardation layer and the second retardation layer is in a range of about 0.1 μm to about 4 μm.

10. The display device of claim 9, wherein a thickness direction retardation of the first compensation layer is the same as that of the second compensation layer.

11. The display device of claim 9, wherein a thickness direction retardation of the first compensation layer is equal to or greater than about 0.25 times that of the first retardation layer and equal to or less than about three times that of the first retardation layer.

12. The display device of claim 11, wherein a thickness direction retardation of the second compensation layer is equal to or greater than about 0.25 times that of the second retardation layer and equal to or less than about three times that of the first retardation layer.

13. The display device of claim 11, wherein the first retardation layer has λ/2 retardation, and the second retardation layer has λ/4 retardation.

14. The display device of claim 13, wherein in-plane retardation of the first retardation layer for incident light of a wavelength of about 550 nm is in a range of about 220 nm to about 270 nm, a short-wavelength dispersion value of the first retardation layer is in a range of about 0.90 to about 1.20, and a long-wavelength dispersion value of the first retardation layer is in a range of about 0.90 to about 1.20.

15. The display device of claim 14, wherein in-plane retardation of the second retardation layer for the incident light of the wavelength of about 550 nm is in a range of about 110 nm to about 150 nm, a short-wavelength dispersion value of the second retardation layer is in a range of about 0.90 to about 1.20, and a long-wavelength dispersion value of the second retardation layer is in a range of about 0.90 to about 1.20.

16. The display device of claim 9, wherein a thickness of the polarization layer is in a range of about 1 μm to about 200 μm.

* * * * *